(12) United States Patent
Qin et al.

(10) Patent No.: US 9,704,594 B1
(45) Date of Patent: Jul. 11, 2017

(54) INTER-CELL INTERFERENCE REDUCTION IN FLASH MEMORY DEVICES

(71) Applicant: Western Digital Technologies, Inc., Irvine, CA (US)

(72) Inventors: Minghai Qin, San Jose, CA (US); Robert Mateescu, San Jose, CA (US); Seung-Hwan Song, San Jose, CA (US); Zvonimir Z. Bandic, San Jose, CA (US)

(73) Assignee: Western Digital Technolgies, Inc., San Jose, CA (US)

( * ) Notice: Subject to any disclaimer, the term of this patent is extended or adjusted under 35 U.S.C. 154(b) by 0 days.

(21) Appl. No.: 15/047,113

(22) Filed: Feb. 18, 2016

(51) Int. Cl.
*G11C 16/04* (2006.01)
*G11C 16/34* (2006.01)
*G06F 11/10* (2006.01)
*G11C 11/56* (2006.01)

(52) U.S. Cl.
CPC ...... *G11C 16/3427* (2013.01); *G06F 11/1044* (2013.01); *G11C 11/5621* (2013.01); *G11C 16/3418* (2013.01)

(58) Field of Classification Search
CPC ... G11C 11/5628; G11C 16/10; G11C 16/349; G11C 16/3418; G11C 16/3427; G11C 11/5635
See application file for complete search history.

(56) References Cited

U.S. PATENT DOCUMENTS

| 8,228,728 | B1 | 7/2012 | Yang et al. |
| 8,462,549 | B2 | 6/2013 | Haratsch et al. |
| 8,484,519 | B2 | 7/2013 | Weathers et al. |
| 8,797,795 | B2 | 8/2014 | Graef et al. |
| 9,106,264 | B2 | 8/2015 | Alhussien et al. |
| 2009/0154236 | A1* | 6/2009 | Kozlov ............... G06F 11/1072 365/185.03 |
| 2011/0246852 | A1* | 10/2011 | Sabbag ............... G06F 11/1048 714/755 |
| 2011/0280068 | A1* | 11/2011 | Patapoutian ........ G11C 11/5628 365/185.03 |
| 2011/0280069 | A1* | 11/2011 | Patapoutian ........ G11C 11/5642 365/185.03 |

(Continued)

OTHER PUBLICATIONS

Lee, J., et al., "Interference compensation technique for multilevel flash memory," Midwest Symposium on Circuits and Systems, Abstract only, 2 pages (Jan. 2011).

(Continued)

*Primary Examiner* — Son Dinh
*Assistant Examiner* — Uyen B Tran
(74) *Attorney, Agent, or Firm* — Patterson & Sheridan, LLP

(57) ABSTRACT

The present disclosure relates to apparatus, systems, and methods that address the migration of least significant in memory cells due to inter-cell interference (ICI). The disclosed embodiments include a control unit that is configured to characterize the vulnerability of memory cells to ICI, and appropriately encode data stored in the vulnerable memory cells to address ICI. This encoding scheme, referred to as "stuck-at" encoding scheme, can be separate from the generic error correcting code encoding. The stuck-at encoding scheme can decrease the bit error rate of flash memory devices.

17 Claims, 19 Drawing Sheets

(56) References Cited

U.S. PATENT DOCUMENTS

| | | | |
|---|---|---|---|
| 2011/0286267 A1* | 11/2011 | Rychlik ................. | G11C 16/10 365/185.03 |
| 2012/0327718 A1* | 12/2012 | Lee ..................... | G11C 11/5628 365/185.22 |
| 2015/0155046 A1* | 6/2015 | Lee ........................ | G11C 16/10 365/185.12 |

OTHER PUBLICATIONS

Taranalli, V., et al., "Error Analysis and Inter-Cell Interference Mitigation in Multi-Level Cell Flash Memories," Toshiba Corporation, Conference Paper, 7 pages (Jun. 2015).

\* cited by examiner

INTER-CELL INTERFERENCE REDUCTION IN FLASH MEMORY DEVICES

BACKGROUND

Field of the Disclosure

The present disclosure relates to apparatus, systems, and methods for reducing inter-cell interference in flash memory devices.

Related Disclosure

A multi-level cell (MLC) is a flash memory cell used to store two or more bits of data in one memory cell in order to increase the level of integration. A memory cell configured to maintain two bits of data is referred to as a two-bit MLC. A two-bit MLC can maintain a voltage level that falls into one of four voltage ranges, each of which represents one of four logical states.

A two-bit MLC-based flash memory device can be disrupted by inter-cell interference (ICI). ICI is a coupling effect that increases a memory cell's voltage level unexpectedly. This unexpected disruption of a cell's voltage level can cause bit errors. ICI can depend on the data stored into the flash memory device, and can also depend on operating conditions, such as endurance cycles, retention, and the ambient temperature. ICI can also depend on the number of bits programmed per cell and the density of the cells. With the continuing demands for smaller flash devices, ICI is expected to increase in the future. Such increase in ICI may substantially degrade a flash system's performance.

SUMMARY

Embodiments of the present disclosure relate to apparatus, systems, and methods for reducing inter-cell interference in flash memory devices.

Some embodiments include a method. In some embodiments, the method can include determining, by a control unit of a memory device comprising a first memory cell, a voltage level of the first memory cell in an erased state, receiving, at the control unit from a host device, a first request to store a first data to the memory device comprising the first memory cell, and encoding, by the control unit, the first data to generate an encoded first data, wherein a logical value of the encoded first data corresponding to a least significant bit of the first memory cell is a predetermined logical value regardless of a content of the first data when the voltage level of the first memory cell is within a predetermined voltage range. The method further includes storing, by the control unit, the logical value of the encoded first data to the least significant bit of the first memory cell.

In some embodiments, encoding the first data further includes encoding the first data using a decodable function that provides the predetermined logical value for the least significant bit of the first memory cell when the voltage level of the first memory cell is greater than a predetermined threshold.

In some embodiments, the predetermined threshold is determined, in part, based on a histogram of voltage levels of all memory cells in the memory device in their erased state.

In some embodiments, the predetermined logical value for the least significant bit of the first memory cell is zero.

In some embodiments, encoding the first data includes encoding the first data using error correcting code.

In some embodiments, the method further includes receiving, at the control unit, a second request to store a second data to the memory device comprising a second memory cell, wherein the second memory cell is capacitively coupled to the first memory cell, wherein encoding the first data to generate the encoded first data comprises encoding the first data in part based on a logical value of the second data to be written into a least significant bit of the second memory cell.

In some embodiments, the first data is associated with a first page and the second data is associated with a second page.

In some embodiments, the memory cell is a two-bit multi-level cell.

Some embodiments include a storage system. The storage system can includes a memory device comprising a first memory cell for maintaining data. The storage system also includes a control unit. The control unit is configured to determine voltage level of the first memory cell in an erased state, receive, from a host device in communication with the storage system, a first request to store a first data to the memory device comprising the first memory cell, and encode the first data to generate an encoded first data, wherein a logical value of the encoded first data corresponding to a least significant bit of the first memory cell is a predetermined logical value regardless of a content of the first data when the voltage level of the first memory cell is within a predetermined voltage range. The control unit is further configured to store the logical value of the encoded first data to the least significant bit of the first memory cell.

In some embodiments, the control unit is configured to encode the first data using a decodable function that provides the predetermined logical value for the least significant bit of the first memory cell when the voltage level of the first memory cell is greater than a predetermined threshold.

In some embodiments, the predetermined threshold is determined, in part, based on a histogram of voltage levels of all memory cells in the memory device in their erased state.

In some embodiments, the predetermined logical value for the least significant bit of the first memory cell is zero.

In some embodiments, the control unit is further configured to receive a second request to store a second data to the memory device comprising a second memory cell, wherein the second memory cell is capacitively coupled to the first memory cell, and encode the first data in part based on a logical value of the second data to be written into a least significant bit of the second memory cell.

In some embodiments, the first data is associated with a first page and the second data is associated with a second page.

In some embodiments, the memory cell is a two-bit multi-level cell.

Some embodiments include a transitory computer readable medium. The transitory computer readable medium includes executable instructions. The executable instructions are operable to cause a control unit to determine a voltage level of a first memory cell in a memory device at an erased state, receive, from a host device, a first request to store a first data to the memory device comprising the first memory cell, and encode the first data to generate an encoded first data, wherein a logical value of the encoded first data corresponding to a least significant bit of the first memory cell is a predetermined logical value regardless of a content of the first data when the voltage level of the first memory cell is within a predetermined voltage range. The executable instructions are also operable to cause the control unit to store the logical value of the encoded first data to the least significant bit of the first memory cell.

In some embodiments, the executable instructions are also operable to cause the control unit to encode the first data using a decodable function that provides the predetermined logical value for the least significant bit of the first memory cell when the voltage level of the first memory cell is greater than a predetermined threshold.

In some embodiments, the predetermined threshold is determined, in part, based on a histogram of voltage levels of all memory cells in the memory device in their erased state.

In some embodiments, the executable instructions are also operable to cause the control unit to receive a second request to store a second data to the memory device comprising a second memory cell, wherein the second memory cell is capacitively coupled to the first memory cell, and encode the first data in part based on a logical value of the second data to be written into a least significant bit of the second memory cell.

In some embodiments, the memory cell is a two-bit multi-level cell.

BRIEF DESCRIPTION OF THE FIGURES

Various objects, features, and advantages of the present disclosure can be more fully appreciated with reference to the following detailed description when considered in connection with the following drawings, in which like reference numerals identify like elements. The following drawings are for the purpose of illustration only and are not intended to be limiting of the invention, the scope of which is set forth in the claims that follow.

DETAILED DESCRIPTION

ICI can affect reliability of data stored in a flash memory device. Suppose that a first memory cell is programmed to store 0V (corresponding to a logic level of 1). When a second memory cell in the neighborhood of the first memory cell is subsequently programmed to store 3.3V (corresponding to a logic level of 0), the floating voltage stored in the first memory cell may subsequently increase to an intermediate value between 0V and 3.3V due to capacitive coupling between the first memory cell and the second memory cell. Such a voltage shift can result in undesirable bit errors.

ICI can be especially problematic when the flash memory device uses a MLC. A MLC can be configured to divide a voltage range (e.g., 0V-3.3V) into more than two states in order to maintain more than two logical states. For example, when a voltage held by a 2-bit MLC is between 0V-0.825V, the MLC can be deemed to maintain a logical state of 11; when a voltage held by a 2-bit MLC is between 0.825V-1.65V, the MLC can be deemed to maintain a logical state of 10; when a voltage held by a 2-bit MLC is between 1.65V-2.475V, the MLC can be deemed to maintain a logical state of 00; and when a voltage held by a 2-bit MLC is between 2.475V-3.3V, the MLC can be deemed to maintain a logical state of 01. Since a fixed voltage range is divided into more than two states, the error margin of the MLC is smaller compared to the error margin of a single-level memory cell (SLC) that divides the fixed voltage range into two logical states. Thus, a MLC can be more susceptible to ICI compared to a SLC.

Figure 1:
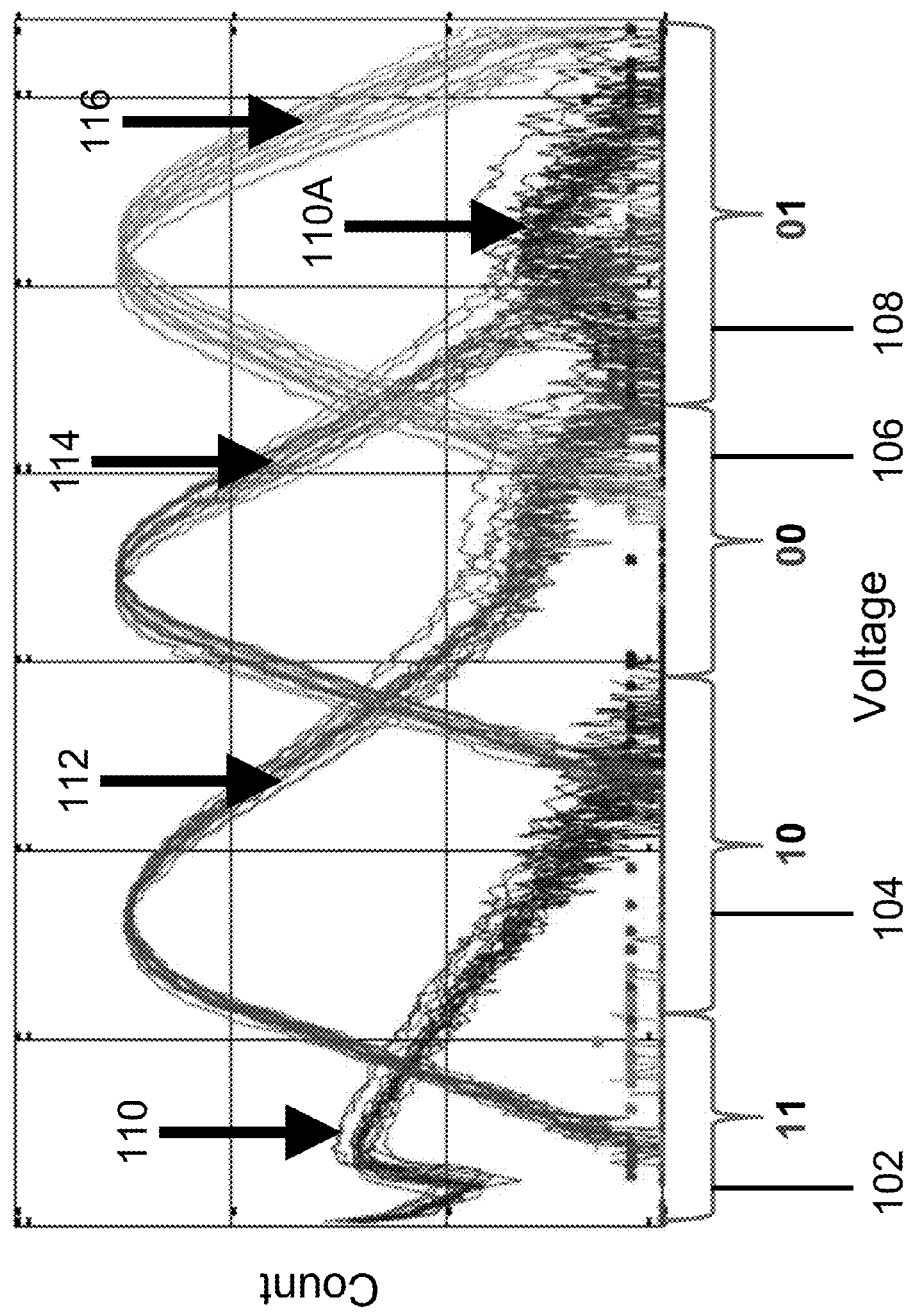
FIG. 1 illustrates a voltage migration in a memory cell due to inter-cell interference accordance with some embodiments.

FIG. 1 illustrates a voltage migration in a MLC due to ICI accordance with some embodiments. In this implementation, the MLC can maintain one of four logical states: 00, 01, 10, and 11. The first voltage range 102 corresponds to 11; the second voltage range 104 corresponds to 10; the third voltage range 106 corresponds to 00; and the fourth voltage range 108 corresponds to 01. In other embodiments, the voltage ranges 102-108 can each correspond to a different one of the four logical states. For example, the voltage ranges 102-108 can correspond to 00, 01, 11, and 10, respectively.

FIG. 1 shows a histogram of voltage levels maintained by MLCs programmed to 11, 10, 00, and 01, in accordance with some embodiments. The first line 110 shows a histogram of voltage levels maintained by MLCs programmed to 11; the second line 112 shows a histogram of voltage levels maintained by MLCs programmed to 10; the third line 114 shows a histogram of voltage levels maintained by MLCs programmed to 00; and the fourth line 116 shows a histogram of voltage levels maintained by MLCs programmed to 01.

Ideally, when a MLC is programmed to maintain 11, the MLC should maintain a voltage that falls within the first voltage range 102, preferably at the middle of the first voltage range 102 to provide for error margins. Therefore, under an ideal condition, the histogram of voltage levels maintained by MLCs programmed to 11 would be entirely contained within the first voltage range 102. Similarly, under an ideal condition, the histogram of voltage levels maintained by MLCs programmed to 10 would be entirely contained within the second voltage range 104; the histogram of voltage levels maintained by MLCs programmed to 00 would be entirely contained within the third voltage range 106; and the histogram of voltage levels maintained by MLCs programmed to 01 would be entirely contained within the fourth voltage range 108.

However, in practice, due to noise and external factors, even when a MLC is programmed to maintain 11, the MLC may maintain a voltage that falls outside of the first voltage range 102. Such a MLC would cause a bit-error. Similarly, in practice, when a MLC is programmed to maintain 10, the MLC may maintain a voltage that falls outside of the second voltage range 104; when a MLC is programmed to maintain 00, the MLC may maintain a voltage that falls outside of the third voltage range 106; and when a MLC is programmed to maintain 01, the MLC may maintain a voltage that falls outside of the fourth voltage range 108. Such MLCs maintaining voltage levels outside of the corresponding ranges can cause bit errors because the information maintained by such MLCs would be different from the information programmed to them.

This problem is even more severe for MLCs programmed to maintain the logical state of 11. As observed in FIG. 1, the second line 112, the third line 114, and the fourth line 116 exhibit a single-modal distribution with the peak appearing within the corresponding ranges 104, 106, and 108. Therefore, the voltage levels of most of the MLCs programmed to 10, 00, and 01 would fall within the corresponding ranges 104, 106, and 108, respectively.

However, the first line 110, corresponding to voltage levels of MLCs programmed to 11, exhibits a dual-modal distribution, with one of the peaks (shown by 110A) appearing in the fourth voltage range 108. The MLCs associated with the fourth voltage range 108 would be read out as 01, instead of the originally programmed value, 11. In other words, the voltage maintained by the MLCs has migrated from a low value to a high value, which manifests itself as a migration of the lowest significant bit (LSB) of the MLC from 1 to 0.

One source of such LSB migration can be ICI. For example, a first MLC programmed with 11 can originally maintain a floating voltage of 0.5V. When a neighboring, second MLC is subsequently programmed to a voltage level of 3.3V (corresponding to 01), the floating voltage level of the first MLC can also increase due to capacitive coupling between the first MLC and the second MLC. In some cases, such capacitive coupling can be sufficiently large so that the floating voltage level of the first MLC is increased to lie within the fourth voltage range 108 corresponding to 01.

To avoid data corruption due to ICI, a MLC-based flash memory device would carefully plan the order in which data pages are written into the memory cells. Unfortunately, even with the careful scheduling of data programming, ICI can cause significant data corruption especially when the flash memory device near its lifetime. In particular, before programming a most significant bit (MSB), the memory system has to measure the least significant bit (LSB) data first (those data are not cached) and program the memory cells to corresponding levels. This scheduling, combined with ICI, can cause the memory cells intended to be at erased states (corresponding to a logical state of "11") to mistakenly be programmed to the highest states (corresponding to bit "01"). This proportion of errors are LSB errors and can be as high as 1e-3 to 1e-2.

The memory system could use stronger error correcting codes to correct this the LSB errors. However, the coding rate loss and the complexity in decoding would be overwhelming. Also a pre-read before programming MSB can be applied, but it incurs decoding delay and complexity during the writing of MSB page.

The disclosed embodiments in the present application provides an efficient solution to the migration of LSBs in memory cells. The disclosed embodiments are designed to understand which memory cells are vulnerable to ICI before programming the memory cells. More particularly, the disclosed embodiments include a control unit that is configured to characterize the vulnerability of memory cells to ICI. Once the control unit knows which memory cells are vulnerable to ICI, the control unit can appropriately encode data to be stored in the vulnerable memory cells to address ICI. For example, the control unit can encode the data such that the encoded data corresponding to the vulnerable memory cells matches the logical value of the LSBs in memory cells after migration. This allows the memory system to trade off the coding rate of the memory system and the bit-error rate of the memory system.

This encoding scheme, referred to as "stuck-at" encoding scheme for reasons provided below, can be separate from the generic error correcting code (ECC) encoding. The stuck-at encoding can decrease the bit error rate (BER) of flash memory devices. The stuck-at encoding can also improve the data integrity and lifetime of memory cells.

In some embodiments, the control unit can be configured to characterize the vulnerability of a memory cell to ICI by analyzing the voltage level of the memory cell when the memory cell is at an erased state (e.g., a logical state of "11"). If the erased state voltage level of a memory cell substantially deviates from a predetermined voltage range for the erased state, the control unit can determine that the memory cell is vulnerable to ICI.

When a memory cell is vulnerable to ICI, the control unit can model the particular memory cell as exhibiting a "stuck-at fault." When the memory cell is determined to exhibit a stuck-at fault, the control unit can be configured to encode the data for the stuck-at fault memory cell to deal with the stuck-at fault. In doing so, the control unit can decrease the bit error rate (BER) of a flash memory device.

In some embodiments, the control unit can determine that a memory cell is vulnerable to ICI when an erased-state voltage level of the memory cell is greater than a predetermined voltage threshold. In other embodiments, the control unit can be configured to determine that a memory cell is vulnerable to ICI when an erased-state voltage level of the memory cell is less than a predetermined threshold.

In some embodiments, the predetermined threshold voltage for determining the vulnerability of memory cells can be set based on a histogram of voltage levels held by memory cells in the erased state. For example, the control unit can be configured to set the predetermined threshold voltage to be the voltage level corresponding to the predetermined percentile in the histogram of voltage levels corresponding to the erased state. For instance, the predetermined threshold voltage can be the voltage level corresponding to the top 0.1% in the histogram of voltage levels corresponding to the erased state.

As discussed above, the control unit can encode data to be stored in stuck-at memory cells. In some embodiments, the control unit can use different stuck-at encoding schemes depending on whether data for neighboring memory cells is available prior to programming stuck-at memory cells.

For example, suppose that a first stuck-at memory cell is configured to store data corresponding to a first page and that neighboring memory cells are configured to store data corresponding to a second page. If the data corresponding to the second page (to be subsequently stored in the neighboring memory cells) is available prior to programming the first stuck-at memory cell, the control unit can use a first type of encoding function. If the data corresponding to the second page (to be subsequently stored in the neighboring memory cells) is not available prior to programming the first stuck-at memory cell, the control unit can use a second type of encoding function.

In some sense, the disclosed control unit can be deemed to change Binary symmetric channel (BSC) channel models to stuck-at models (equivalent to Binary erasure channel (BEC) in channel capacity), by taking advantage of side information available to the control unit.

In some embodiments, the disclosed control unit can be implemented in conjunction with Error-Correcting Codes (ECC). Some memory systems use ECC to reduce the bit error rate of flash memory devices. The disclosed control unit can augment the ECC-based memory systems with stuck-at fault encoding to further reduce the bit error rate of flash memory devices.

Figure 2:
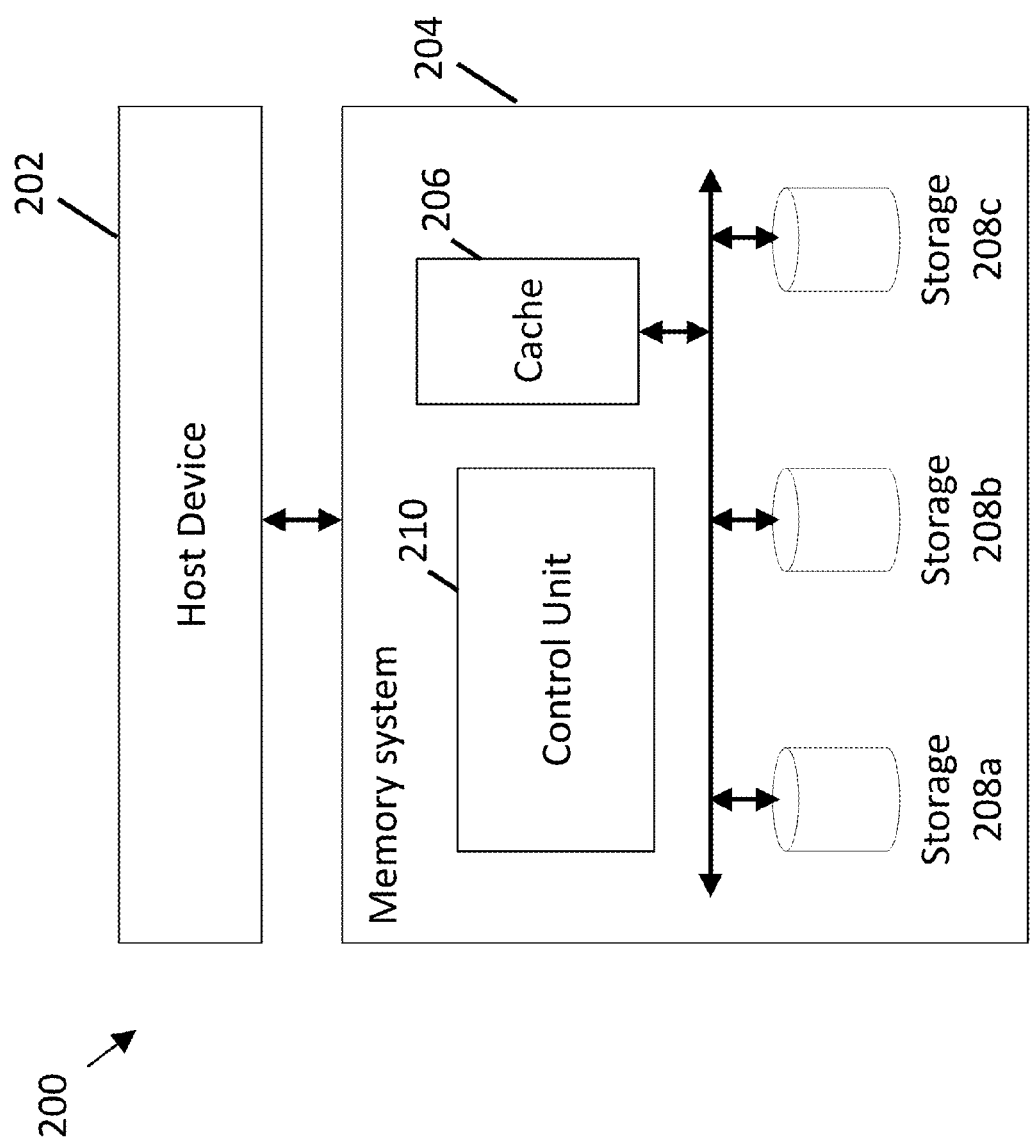
FIG. 2 illustrates an exemplary computing system having a memory system in accordance with some embodiments.

FIG. 2 illustrates an exemplary computing system 200 having a memory system in accordance with some embodiments. The computing system 200 can include a host device 202 and a memory system 204, where the memory system 204 includes a cache 206, one or more storage devices 208a-208c, and a control unit 210.

The host device 202 can include any computer system that uses and accesses a memory system 204 for data read and data write operations. Such a host device 202 may run applications such as databases, file systems, and web services. In some embodiments, the host device 202 can be physically co-located with (e.g., located physically close to) the memory system 204. In such embodiments, the host device 202 can be configured to communicate with the memory system 204 via a bus. The bus can include, for example, PCI, PCI-Express, PCI-X, InfiniBand, Hyper-Transport, SCSI PCI-E card, SATA PCI-E card, iSCSI adaptor card, and Fibre Channel PCI-E card. In other embodiments, the host device 202 can be physically separated from the memory system 204. In such embodiments, the host device 202 can communicate with the memory system 204 via a communication network. The network can include the Internet, a local area network (LAN), a packet data network, a legacy network, or any type of network that is capable of providing data communication between the host device 202 and the memory system 204.

The cache 206 can include a memory device with fast access time. In some embodiments, the fast-access memory device in the cache 206 can include a static random access memory (SRAM). In other embodiments, the fast-access memory device in the cache 206 can include a solid state drive (SSD), which may include any solid state-based memory devices such as NAND gate flash memory, NOR gate flash memory, phase change memory (PCM), or any nonvolatile solid state memory having the properties of, for example, fast access time.

The storage device 208 can include a non-volatile storage device. The non-volatile storage device can include a flash memory, a non-volatile RAM (NVRAM), a micro-electro-mechanical systems (MEMS) storage, and/or a battery backed dynamic random access memory (DRAM). In some embodiments, the non-volatile storage device can include a plurality of memory cells that are each capable of storing more than one bit. For example, the non-volatile storage device can include a Multi-Level flash memory cell (MLC), such as a two-bit MLC.

The control unit 210 can include a memory controller configured to control data storage operations of the memory system 204. The memory controller can be configured to receive a data storage request to store data referenced by the data storage request. The memory controller can also be configured to receive a data retrieval request to retrieve data referenced by the data storage request.

In some embodiments, the control unit 210 can include an error correcting code (ECC) engine for encoding data prior to storage in the storage device 208 and/or decoding data when retrieved from the storage device 208.

In some embodiments, the control unit 210 can include a stuck-at encoder for encoding data prior to storage in the storage device 208. In some embodiments, the control unit 210 can include a stuck-at decoder for decoding data when retrieved from the storage device 208. In some embodiments, the stuck-at encoder and the stuck-at decoder can be part of a stuck-at engine residing in the control unit.

In some embodiments, the control unit 210 is implemented in hardware. The hardware can include logic circuits and/or memory for selecting target memory blocks and for evicting data from the selected target memory blocks to accommodate new data. In some embodiments, the hardware for the control unit 210 can be implemented using a hardware description language including Verilog, VHSIC hardware description language (VHDL), and BlueSpec™ (Bluespec Inc., Framingham, Mass.), and be synthesized using logic synthesis tools including Design Compiler® (Synopsis Inc., Mountain View, Calif.), Encounter RTL compiler (Cadence Design Systems Inc., San Jose, Calif.), RealTime Designer (Oasys Design Systems, Inc., Santa Clara, Calif.), and BooleDozer (International Business Machine, Endicott, N.Y.).

In some embodiments, a control unit 210 is implemented as a part of firmware. In some embodiments, the control unit 210 can be implemented in software using memory such as a non-transitory computer readable medium, a programmable read only memory (PROM), or flash memory. The software can run on a processor, which may reside in the control unit 210, that executes instructions or computer code, which can be embodied in a non-transitory computer readable medium embodied in the control unit 210.

Figure 3A:
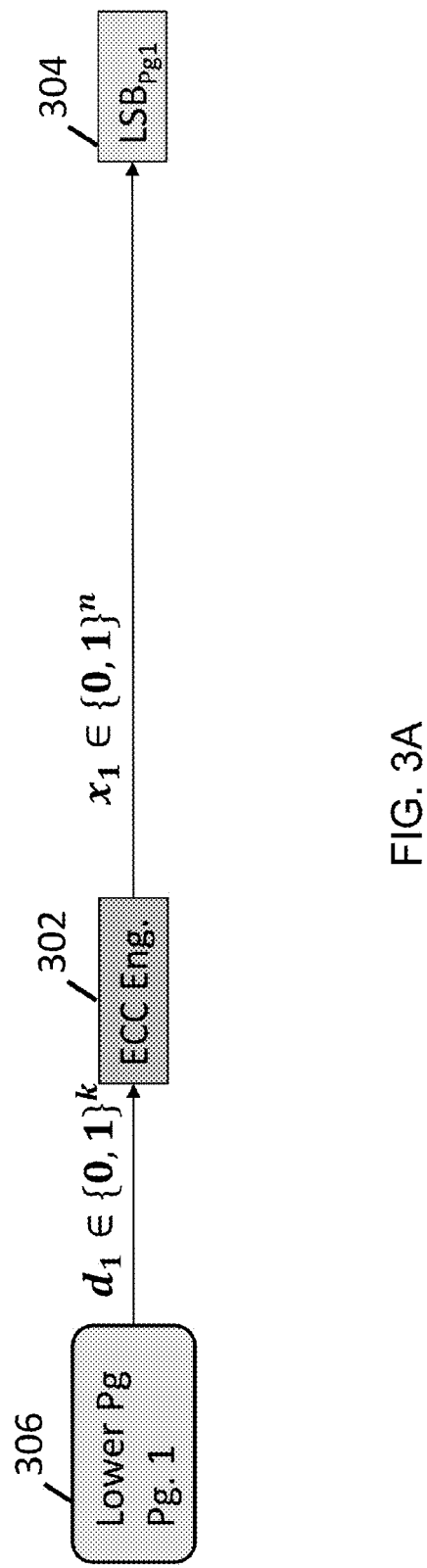
FIGS. 3A-3D illustrate how inter-cell interference affects integrity of data stored in flash memory devices.

FIGS. 3A-3D illustrate how ICI affects integrity of data stored in flash memory devices. FIG. 3A shows a first error correcting code (ECC) engine 302, a first memory cell 304 corresponding to a least significant bit, and the first data 306 to be written to the first memory cell 304. The first data 306 can correspond to data in a first page.

When the control unit 210 receives the first data 306, the control unit 210 can store the first data 306 in the first memory cell 304. Before the control unit 210 stores the first data 306, the control unit 210 can optionally use the first ECC engine 302 to encode the first data 306. The raw data 306 prior to encoding is referred to as "d"; the encoded data 306 is referred to as "x".

Figure 3B:
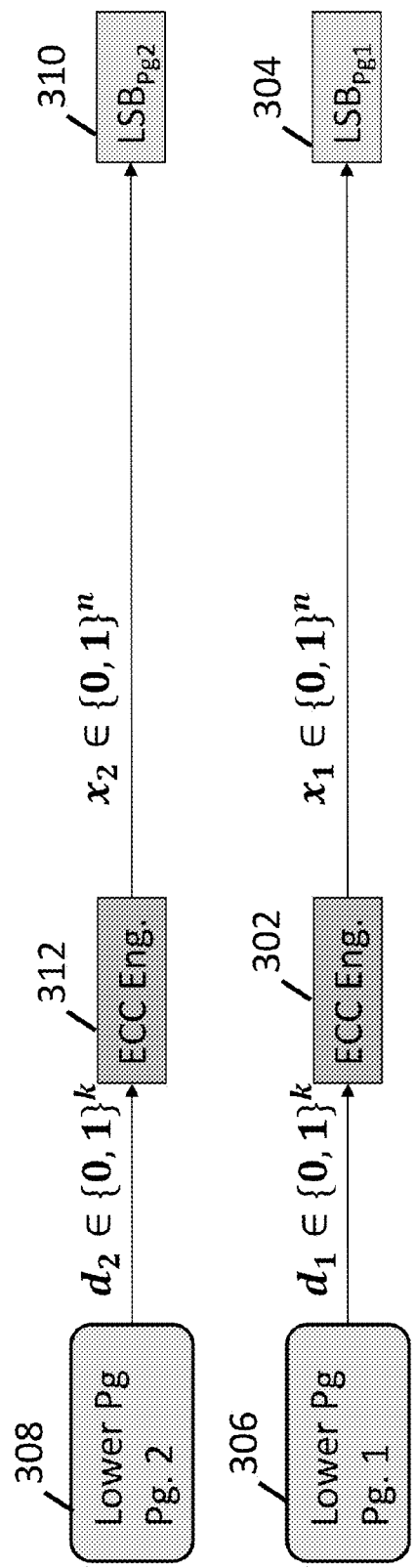

As shown in FIG. 3B, the control unit 210 may subsequently receive a second data 308, corresponding to a second page, to be stored in a second memory cell 310. In response, the control unit 210 can store the second data 308 in the second memory cell 310. Before the control unit 210 stores the second data 308, the control unit 210 can optionally use a second ECC engine 312, which may be part of the control unit 210, to encode the second data 308.

Figure 3C:
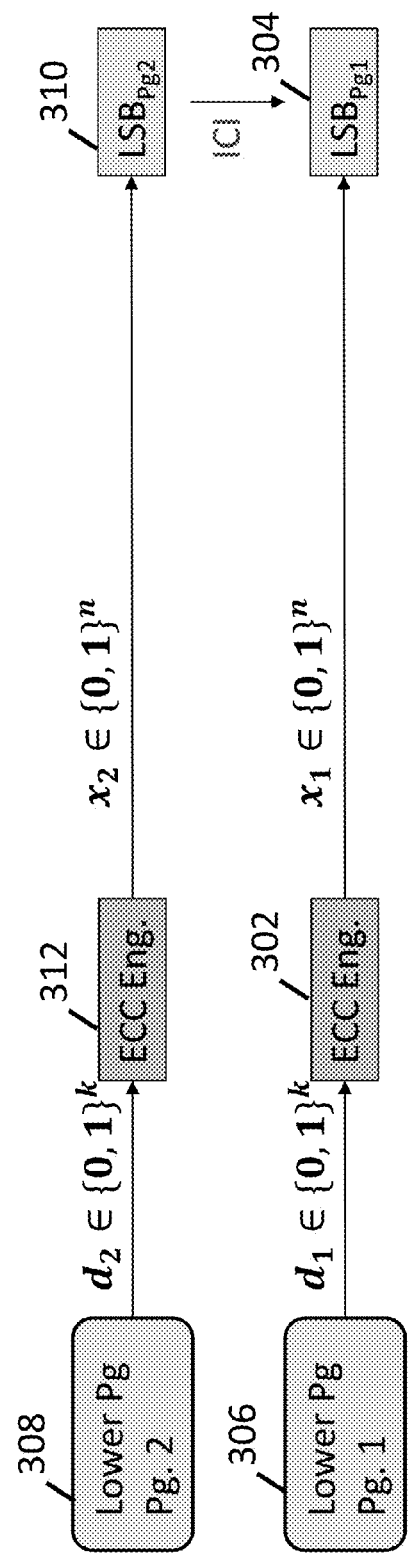
Figure 3D:
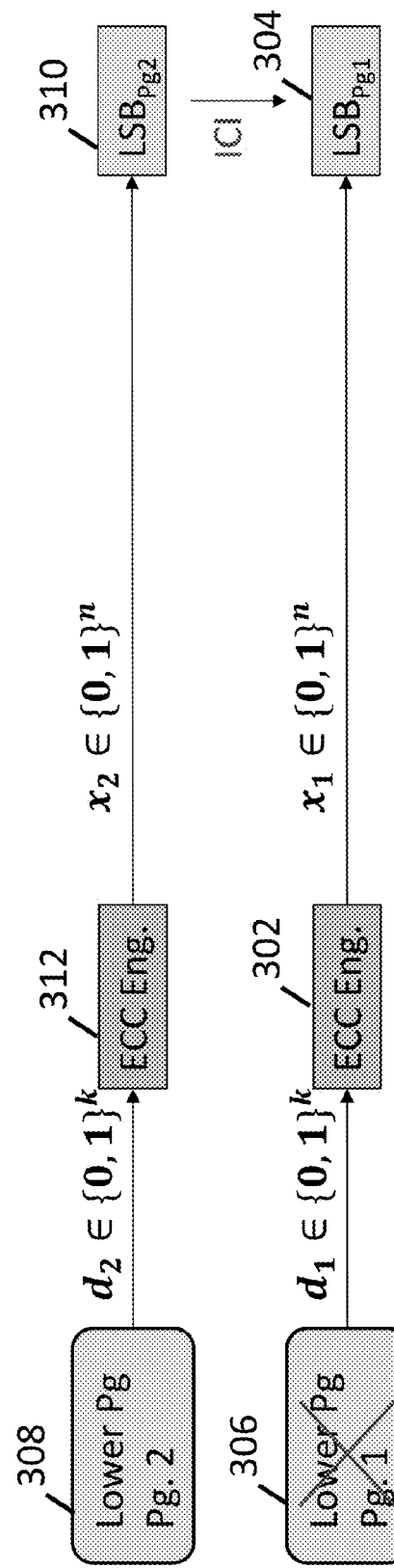

As shown in FIG. 3C, due to a capacitive coupling between the first memory cell 304 and the second memory cell 310, the data stored in the first memory cell 304 may be affected by the data being stored in the second memory cell 310. This coupling between the first memory cell 304 and the second memory cell 310 is referred to as ICI. If the data stored in the first memory cell 304 is in fact corrupted by ICI, when the control unit 210 later retrieves data from the first memory cell 304, it would not correspond to the original data 306 programmed into the first memory cell 304, as illustrated in FIG. 3D.

In some embodiments, the control unit 210 addresses data corruption from ICI by modeling memory cells vulnerable to ICI as exhibiting stuck-at faults. Such memory cells are herein referred to as stuck-at memory cells. A stuck-at memory cell is a memory cell that can only store a single digital value in one of the plurality of logical states maintained by the memory cell. For example, a stuck-at memory cell having a LSB stuck-at fault value of 1 can only store a logic high digital value for the LSB, and a stuck-at memory cell having a LSB stuck-at fault value of 0 can only store a logic low digital value for the LSB. Thus, only a logic high digital value can be read from the LSB of a stuck-at memory cell having a LSB stuck-at fault value of 1 (e.g., stuck-at 1), and only a logic low digital value can be read from the LSB of a stuck-at memory cell having a stuck-at fault value of 0 (e.g., stuck-at 0).

The following embodiments assume that two-bit memory cells use binary representations shown in FIG. 1. However, memory cells may use other binary representations. In such cases, an ordinary skill in the art would be able to modify one or more aspects of the following embodiments to comply with associated binary representations of memory cells.

In some embodiments, the control unit 210 can model the stuck-at memory cell as having a LSB stuck-at fault value of 0, hereinafter simply referred to as a stuck-at fault value of 0. As shown by FIG. 1, ICI may cause a migration of voltage from a low level to a high level, which causes a migration of the logic level from 11 to 01. Therefore, if ICI causes voltage migration, the LSB of the memory cell is correspondingly migrated from 1 to 0. In other words, the ICI causes the LSB of the memory cell to be stuck at 0. Therefore, if a memory cell is vulnerable to ICI, the control unit 210 can preemptively classify the memory cell as having a stuck-at fault at 0 because the memory cell would likely maintain the LSB of 0, regardless of whether the LSB of the memory cell is programmed to 0 or 1.

In some embodiments, when one or more memory cells are determined to have stuck-at faults, the control unit 210 can use a stuck-at encoder to appropriately encode data prior to storing the data to the stuck-at memory cells. For example, the control unit 210 can provide, to the stuck-at encoder, the addresses of MLCs having the stuck-at faults and the digital value of the stuck-at faults (e.g., zero). Subsequently, the stuck-at encoder can generate the encoded data bits and the encoded redundant bits using the digital value of the stuck-at faults and addresses of the stuck-at faults. The encoded data bits and the encoded redundant bits are stored in the memory cells of the memory device, including the stuck-at memory cells.

Subsequently, at a later time, the control unit 210 may be requested to read data from the memory device. If so, the control unit 210 can retrieve the encoded data bits and the encoded redundant bits from the memory cells, including the stuck-at memory cells. The control unit 210 can then use the stuck-at decoder to decode the encoded redundant bits and then decodes the encoded data bits using the decoded redundant bits to regenerate the data bits. The data bits regenerated by the stuck-at decoder would not contain errors that would have been caused by ICI.

Figure 4:
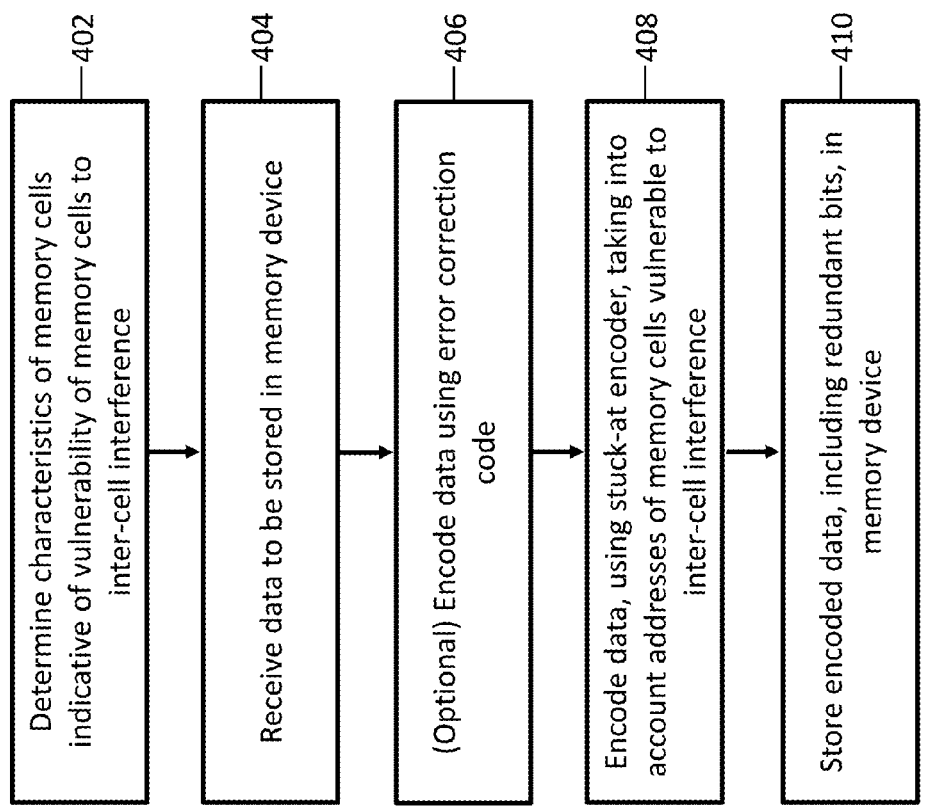
FIG. 4 shows a process of storing data to a memory device having memory cells vulnerable to inter-cell interference/in accordance with some embodiments.
Figure 5:
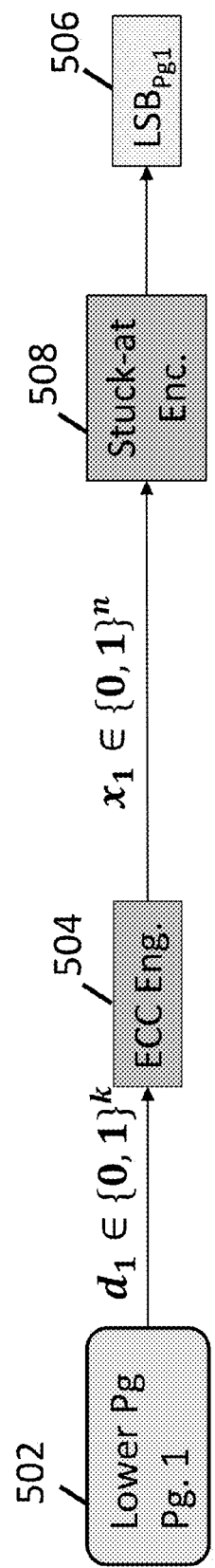
FIG. 5 shows a corresponding illustration of process in FIG. 4 in accordance with some embodiments.

FIG. 4 shows a process of storing data to a memory device having memory cells vulnerable to ICI in accordance with some embodiments. FIG. 5 shows a corresponding illustration of process in FIG. 4 in accordance with some embodiments.

In step 402, the control unit 210 can determine characteristics of memory cells in a memory device. The characteristics of memory cells can be indicative of vulnerability of memory cells to inter-cell interference. One of such characteristics can include a voltage level of a memory cell when the memory cell is programmed to an erased state. When a particular memory cell at an erased state (e.g., the logical state of 1) maintains a high voltage, that cell can be more vulnerable to ICI than other cells that have a lower voltage at an erased state. Therefore, the voltage level at the erased state can be indicative of the vulnerability of memory cells to ICI.

In step 404, the control unit 210 can receive data to be stored in the memory device. For example, as shown in FIG. 5, the control unit 210 can receive the first data 502 associated with page 1 to be stored in a first memory cell 506.

In step 406, the control unit 210 can optionally encode the received first data 502 using an error correcting code (ECC) engine 504, shown in FIG. 5, to generate encoded data. This ECC engine 504 can be part of the control unit 210 itself.

In step 408, the control unit 210 can perform additional encoding, referred to as a stuck-at encoding, on the encoded data to address bit-error that may arise from ICI. This stuck-at encoding can be performed using a stuck-at encoder 508, shown in FIG. 5. The stuck-at encoder 508 can be part of the control unit 210 itself.

Figure 6:
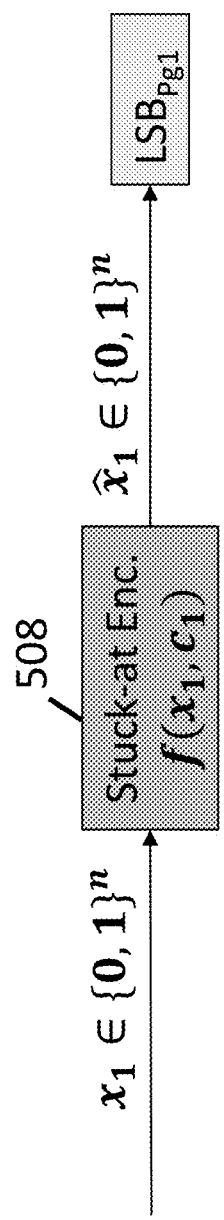
FIG. 6 illustrates an operation of a stuck-at encoder in accordance with some embodiments.

In some embodiments, the stuck-at encoder 508 can operate on the encoded data in part based on the characteristics of memory cells determined in step 402. FIG. 6 illustrates an operation of a stuck-at encoder in accordance with some embodiments. The stuck-at encoder 508 can be configured to operate on the encoded data "x" in part based on the parameter "c" obtained in step 402. In some embodiments, the parameter c can refer to the voltage level of a memory cell at the erased state.

In some embodiments, the stuck-at encoder 508 can be configured to encode the input data such that the LSB of the logical state programmed into the vulnerable memory cell 506 is always zero. For example, suppose that the first memory cell 506 is vulnerable to ICI because the voltage level of the first memory cell 506 at the erased state is too high (e.g., "c" is greater than a predetermined threshold voltage). In this case, the stuck-at encoder 508 can encode the input data (e.g., the encoded data provided by the ECC engine 504) such that the LSB of the output data $(x)_1$ of the stuck-at encoder 508 for that first memory cell 506 is always zero. This way, the LSB of the first memory cell 506 would always maintain correct information even if the LSB of the first memory cell 506 migrates due to ICI. This benefit may come at the cost of a reduced coding rate.

In some embodiments, this stuck-at encoding operation can be modeled as an encoding function, $f(x, c)$. The encoding function $f(x, c)$ can be any decodable function of x that satisfies the following:

$$f(x,c)=0 \text{ if } c>\delta,$$

where $\delta$ is a predetermined threshold voltage. An example of the encoding function $f(x, c)$ is provided in "Partitioned linear block codes for computer memory with 'stuck-at' defects", IEEE Transactions on Information Theory, vol. 29, no. 6, pp. 831-842, which is herein incorporated by reference in its entirety.

In some embodiments, the control unit 210 can determine the threshold voltage δ based, in part, on the histogram of voltage levels of all memory cells (in the memory device) in their erased state. For example, the control unit 210 can set the threshold voltage δ to be the predetermined percentile (e.g., the top 10%) of voltage levels of all memory cells (in the memory device) in their erased state.

Figure 7:
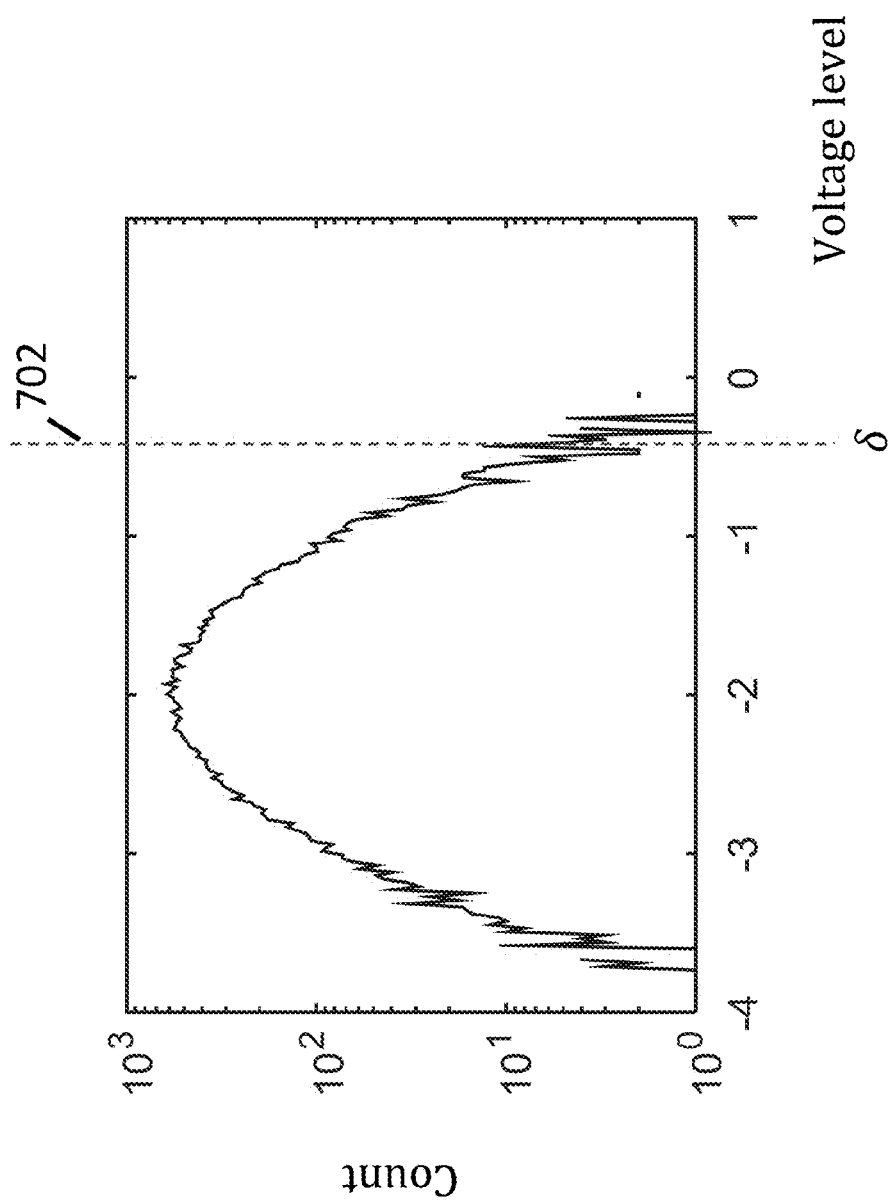
FIG. 7 shows a histogram of voltage levels of memory cells in their erased state in accordance with some embodiments.

FIG. 7 shows a histogram of voltage levels of all memory cells (in the memory device) in their erased state in accordance with some embodiments. The dotted line 702 shows the threshold voltage δ. If a memory cell in an erased state has a voltage level greater than this threshold voltage δ, that memory cell would be deemed vulnerable to ICI and would be deemed to have a stuck-at fault at 0.

Figure 8:
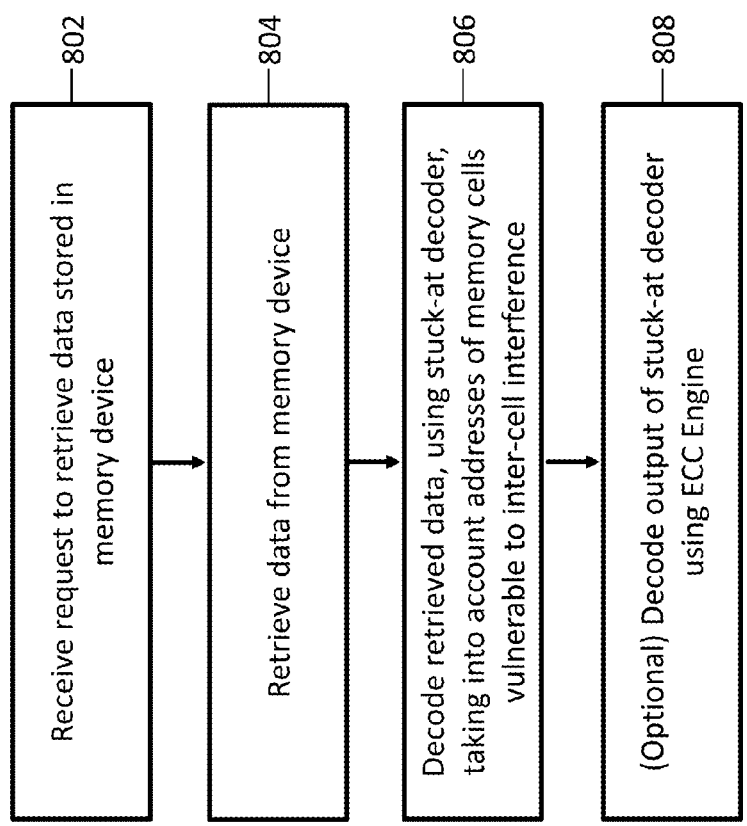
FIG. 8 shows a process of reading data from a memory device having memory cells vulnerable to inter-cell interference in accordance with some embodiments.
Figure 9:
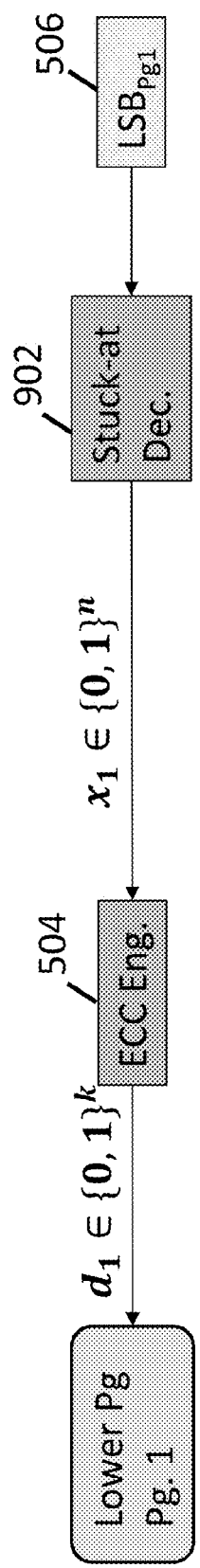
FIG. 9 shows a corresponding illustration of process in FIG. 8 in accordance with some embodiments.

FIG. 8 shows a process of reading data from a memory device having memory cells vulnerable to ICI in accordance with some embodiments. FIG. 9 shows a corresponding illustration of process in FIG. 8 in accordance with some embodiments.

In step 802, the control unit 210 can receive a request to retrieve data stored in a memory device having data encoded using a stuck-at encoding scheme. In step 804, the control unit 210 can retrieve the requested data from the memory device, and provide the retrieved data to a stuck-at decoder 902, shown in FIG. 9. In some embodiments, the stuck-at decoder 902 can be part of the control unit 210. In some embodiments, the stuck-at encoder 508 and the stuck-at decoder 902 can be implemented in a single stuck-at engine.

In step 806, the stuck-at decoder 902 can decode the retrieved data, taking into account addresses of memory cells vulnerable to inter-cell interference. In some embodiments, when the stuck-at encoder 508 implements a decodable function, $f(x, c)$, the stuck-at decoder 902 can decode this function to decode the retrieved data. An example of the decodable function, $f(x, c)$, is provided in "Partitioned linear block codes for computer memory with 'stuck-at' defects", IEEE Transactions on Information Theory, vol. 29, no. 6, pp. 831-842, which is herein incorporated by reference in its entirety.

In step 808, if the data was encoded using an ECC engine 504 in step 406, the control unit 210 can decode the data received from the stuck-at decoder 902 using the ECC engine 504, and provide the decoded data to the device that requested the data in step 802.

In some embodiments, when the control unit 210 programs the first memory cell 506 using the first data 502, the control unit 210 may also have second data to be stored in a second memory cell that is capacitively coupled to the first memory cell 506. The capacitive coupling between the first memory cell 506 and the second memory cell can refer to a transfer of energy between the first memory cell 506 and the second memory cell through the capacitance between them. In this case, the control unit 210 can use the second data to better predict whether the first memory cell 506 would experience ICI from the second memory cell, even if the first memory cell 506 may be vulnerable to ICI.

For example, even if the LSB of the first memory cell 506 is vulnerable to ICI, the LSB of the first memory cell 506 may not experience data corruption from ICI when the LSB of the second data stored in the second memory cell is identical to the LSB of the first data stored in the first memory cell 506. Therefore, the control unit 210 can use the LSB of the second data to better predict whether the LSB of the first memory cell 506 would experience ICI from the second memory cell. This allows the control unit 210 to classify a smaller number of memory cells as having stuck-at faults, thereby improving the storage capacity (e.g., the coding rate) of data being stored in the memory device.

Figure 10:
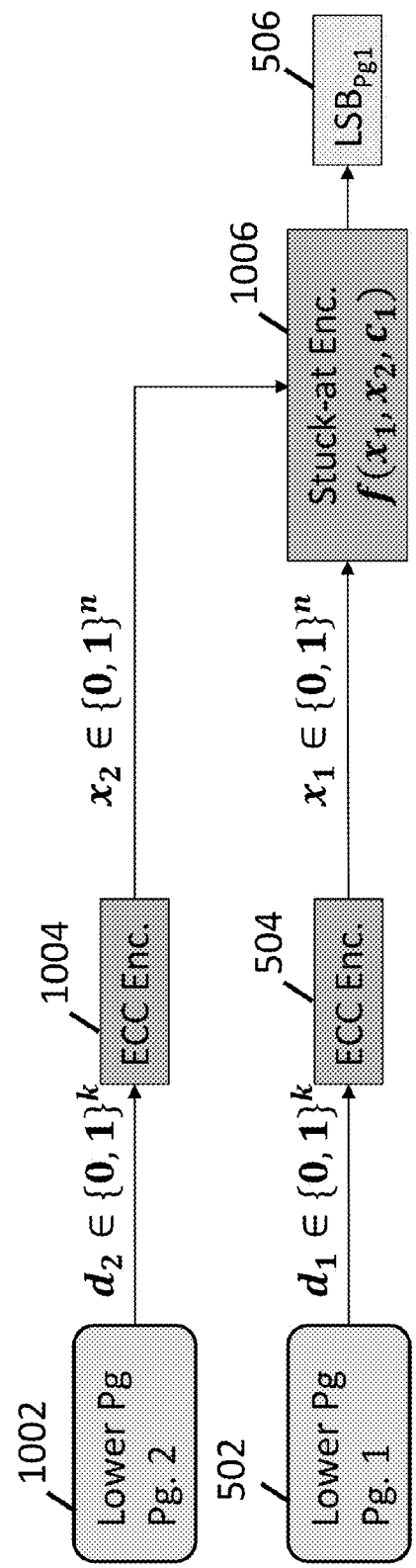
FIG. 10 illustrates a process of programming a memory cell when data to be stored in neighboring memory cells is available in accordance with some embodiments.

FIG. 10 illustrates a process of programming a memory cell when data to be stored in neighboring memory cells is available in accordance with some embodiments. FIG. 10 illustrates that, when the control unit 210 is preparing data to be written into the first memory cell 506, the control unit 210 in fact has second data (e.g., a subsequent page of data) to be stored in a second memory cell that is capacitively coupled to the first memory cell 506. This second data can cause ICI because (1) the second data is written into a second memory cell that is capacitively coupled to the first memory cell 506 and (2) the second data is programmed subsequent to the programming of the memory cell 506.

However, this second data would cause data corruption in the LSB of the first memory cell 506 only if the LSB of the second data has a logical value of 0 (e.g., a high voltage level). In other words, the stuck-at encoder 1006 need not clamp the LSB of the memory cells to a logical value of 0 when LSB of the neighboring memory cells is to be programmed to a logical value of 1. Therefore, the stuck-at encoder 1006 can use this information to perform stuck-at encoding only on the LSB of a memory cell whose neighboring memory cells' LSBs (e.g., LSB of memory cells corresponding to subsequent pages of data) are programmed to a logical value of 0.

In some embodiment, the stuck-at encoding operation for the first data 502, in case second data 1002 is available, can be modeled as a decodable function $f_1(x_1, x_2, c_1)$, where $x_1$ refers to the LSB of the first data 502, $x_2$ refers to the LSB of the second data 1002, and $c_1$ refers to the voltage level of the memory cell 506 at an erased state. The decodable function $f_1(x_1, x_2, c_1)$ can be any function such that $f_1(x_1, x_2, c_1)=0$ when $c_1>6$ and $x_2=0$. This decodable function of the stuck-at encoder 1006 provides a better coding rate compared to the decodable function of the stuck-at encoder 508 because a less number of memory cells needs to be stuck-at zero.

When data encoded by the stuck-at encoder 1006 is later retrieved, the control unit 210 can use a stuck-at decoder that is capable of decoding the function $f_1(x_1, x_2, c_1)$. The process for retrieving and decoding the encoded data is substantially similar to the process illustrated in FIG. 8.

In some embodiments, the decodable function $f_1$ of FIG. 10 can be extended to account for memory cells corresponding to other pages, for example, a third page, a fourth page etc. For example, the decodable function $f_1$ of FIG. 10 can be generalized as follows:

$$f_1(x_1, \ldots x_N, c_1)$$

where N−1 is the total number of memory cells that are capacitively coupled to the first memory cell 506, and $x_i$, where i=1 N, is a logical value of a least significant bit stored in the $i^{th}$ memory cell.

Figure 11A:
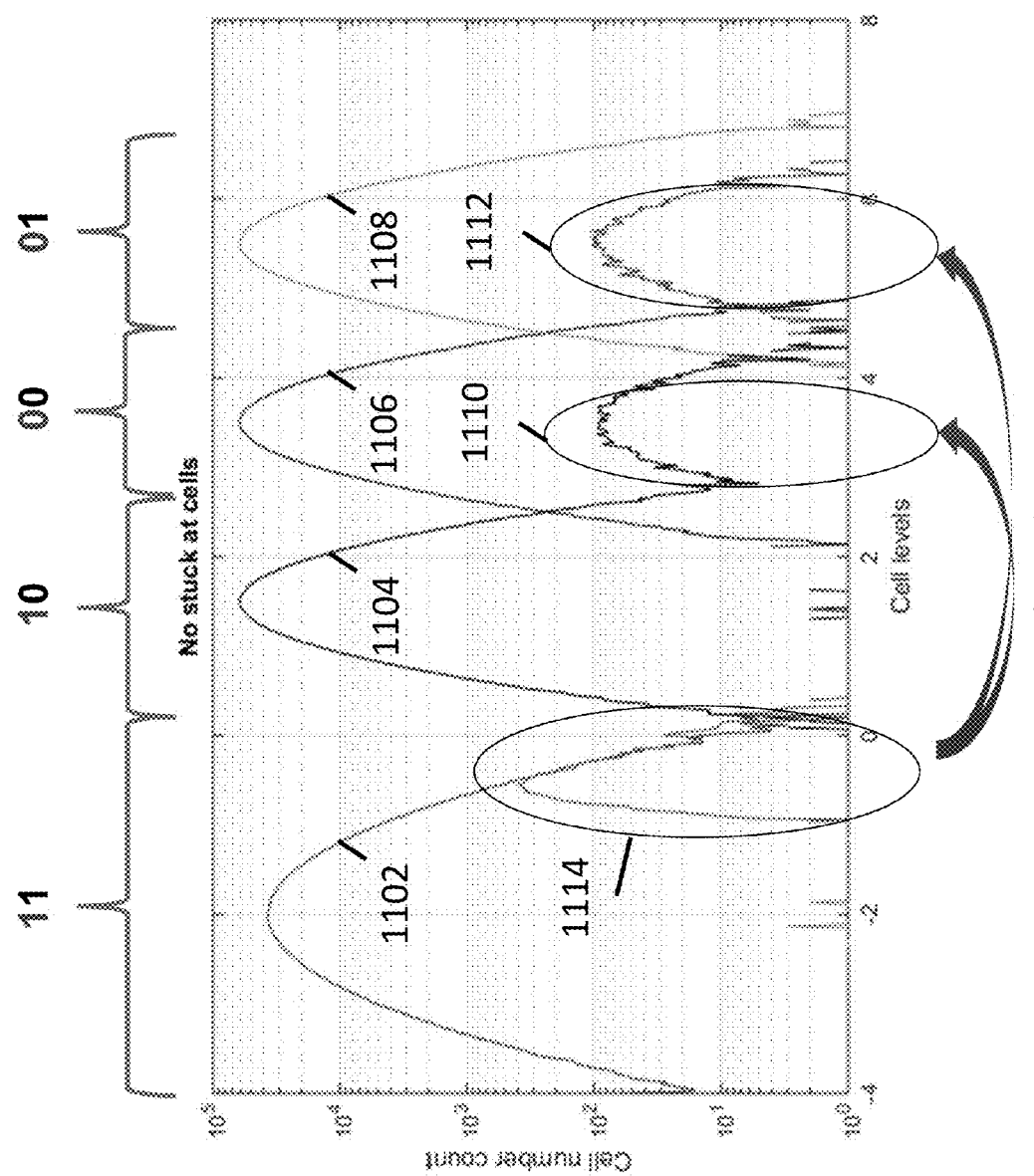
FIGS. 11A-11D illustrate how a stuck-at encoding scheme improves a bit-error rate in accordance with some embodiments.

FIGS. 11A-11D illustrate how a stuck-at encoding scheme improves a bit-error rate in accordance with some embodiments. In FIG. 11A, lines 1102-1108 show the distribution of memory cells in the logical states 11, 10, 00, and 01, respectively, without implementing the stuck-at encoding scheme. Some of the memory cells programmed to the logical state 11 have migrated to the logical state 00 and 01 due to ICI. These memory cells are shown by 1110 and 1112, respectively. Before ICI caused the migration, these memory cells used to have voltage levels indicated as 1114.

Figure 11B:
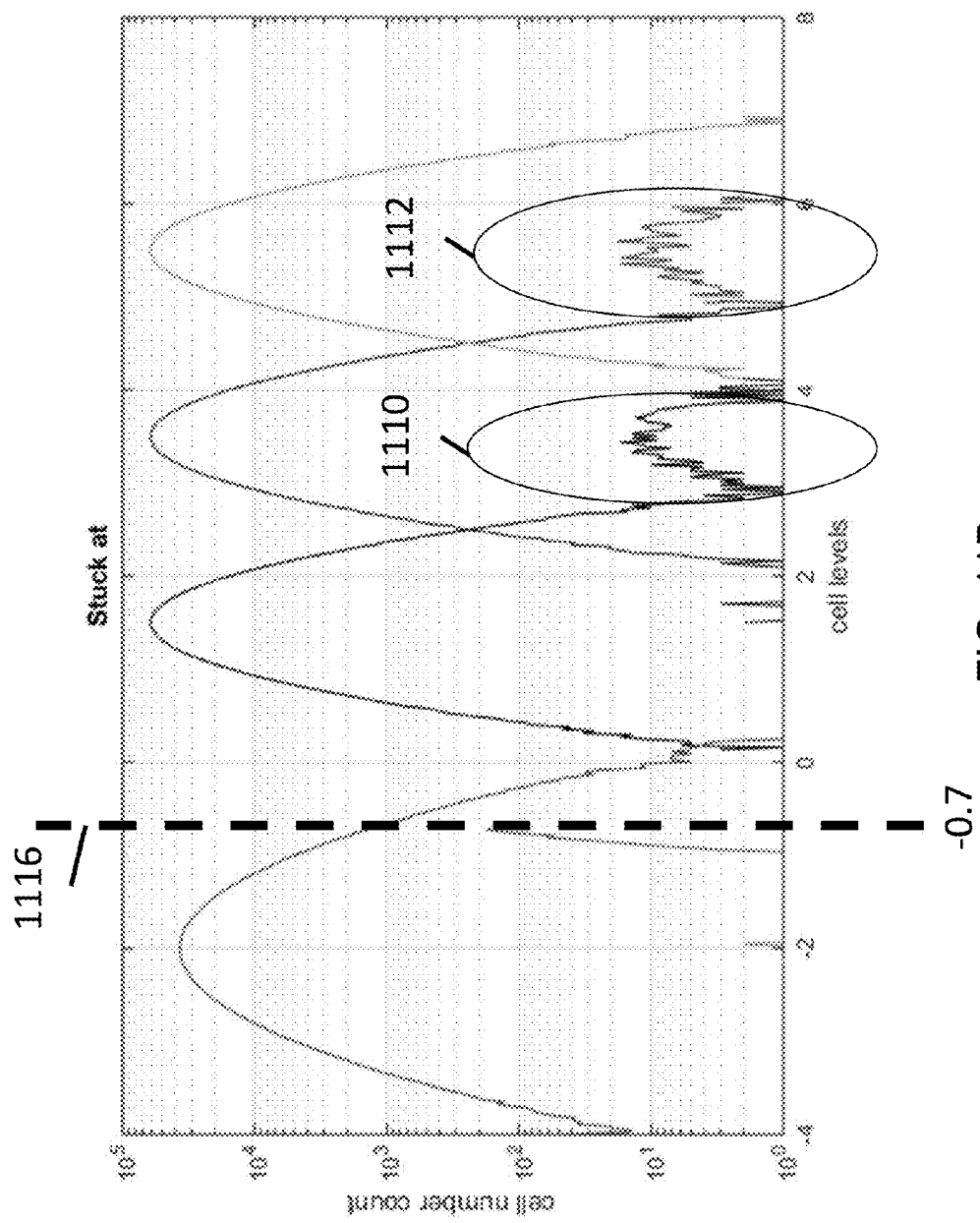
Figure 11C:
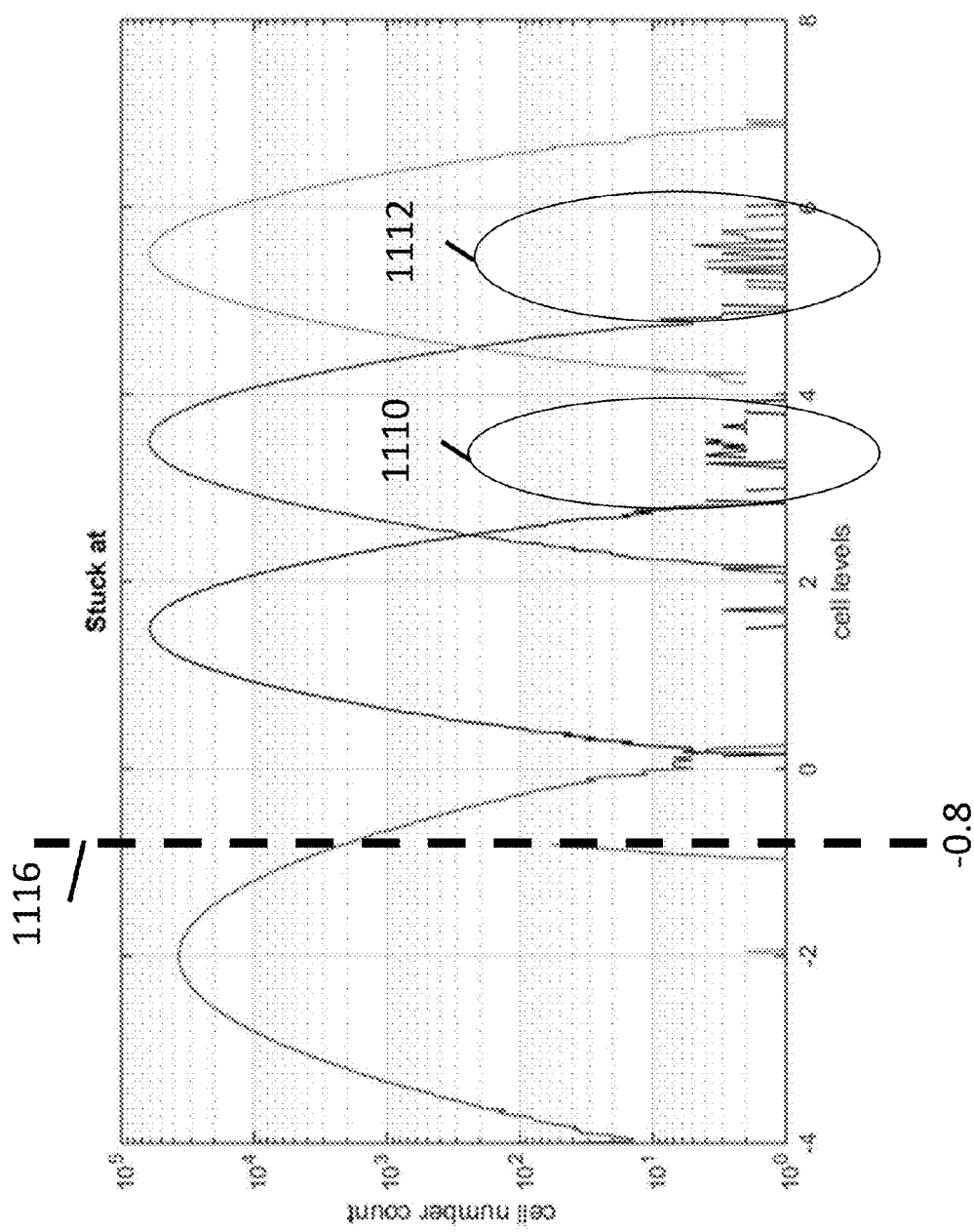
Figure 11D:
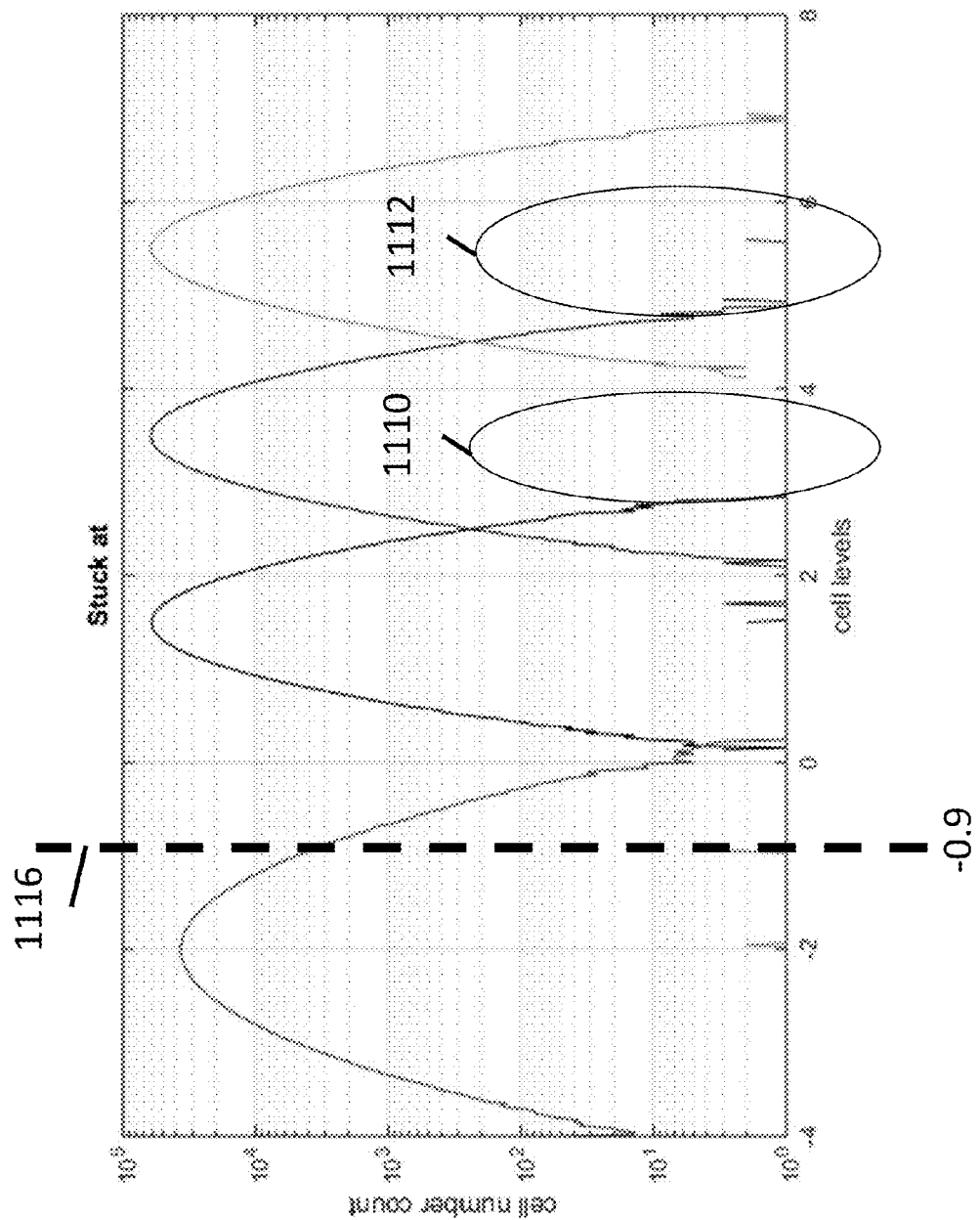

FIGS. 11B-11D illustrate the effect of the disclosed stuck-at encoding scheme. As the threshold voltage level 1116 is modified, the number of cells experiencing LSB migration 1114 and 1116 is reduced. This shows that the disclosed stuck-at encoding scheme can address the LSB migration issue by tying the logical state of the LSB of these vulnerable cells to "0". This allows the memory system to prevent ICI from corrupting the data stored in these vulnerable cells.

Figure 12:
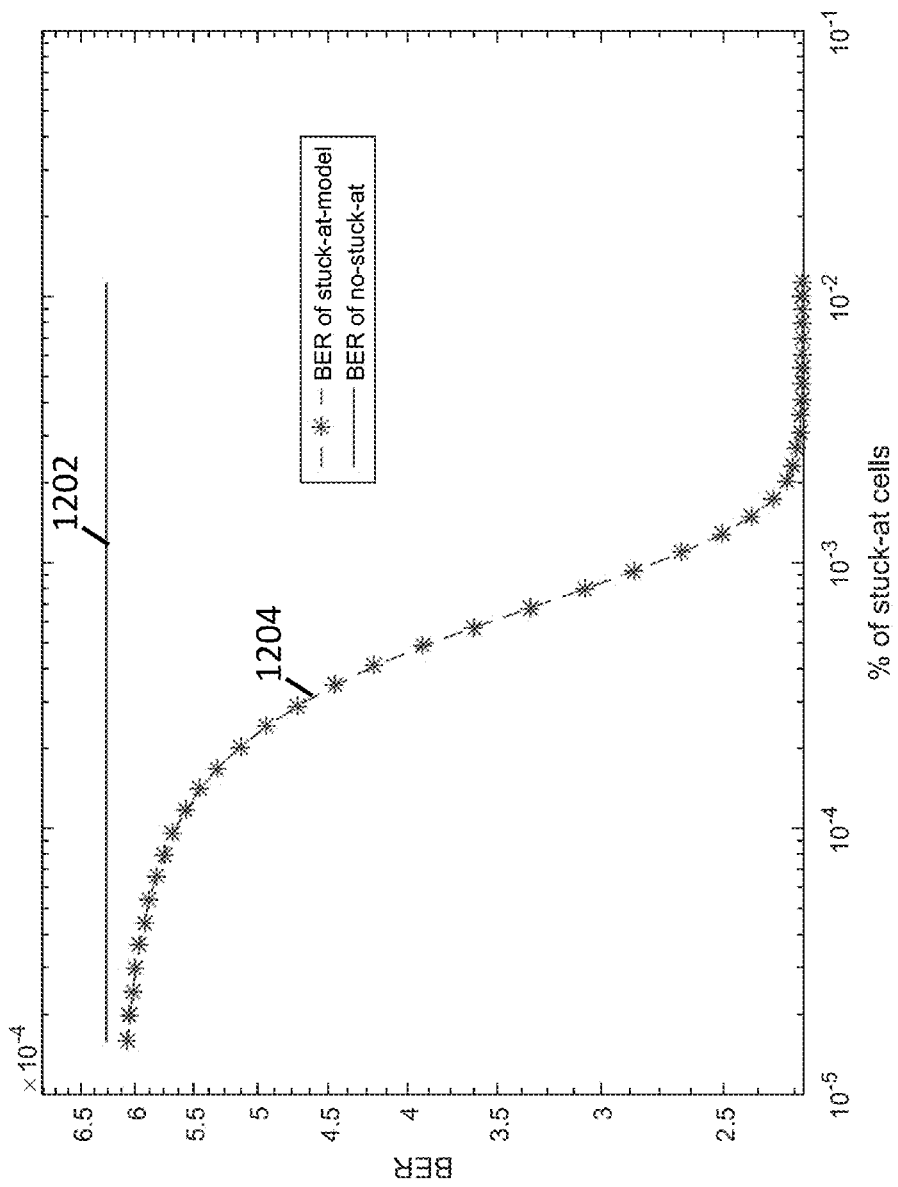
FIG. 12 illustrates that a stuck-at encoding scheme can improve the bit-error rate of the memory system in accordance with some embodiments.

FIG. 12 illustrates that a stuck-at encoding scheme can improve the bit-error rate of the memory system in accordance with some embodiments. When the control unit does not implement the stuck-at encoding scheme, the bit error rate (BER) of the memory system is about $6.2 \times 10^{-4}$, as shown by line 1202. However, when the control unit does implement the disclosed stuck-at encoding scheme to address ICI, the BER of the memory system is improved, as shown by the line 1204, as a larger number of memory cells are classified as stuck-at fault memory cells. In fact, the BER falls below $2.3 \times 10^{-4}$ when about 0.5% of memory cells in the memory device are classified as stuck-at memory cells.

Figure 13:
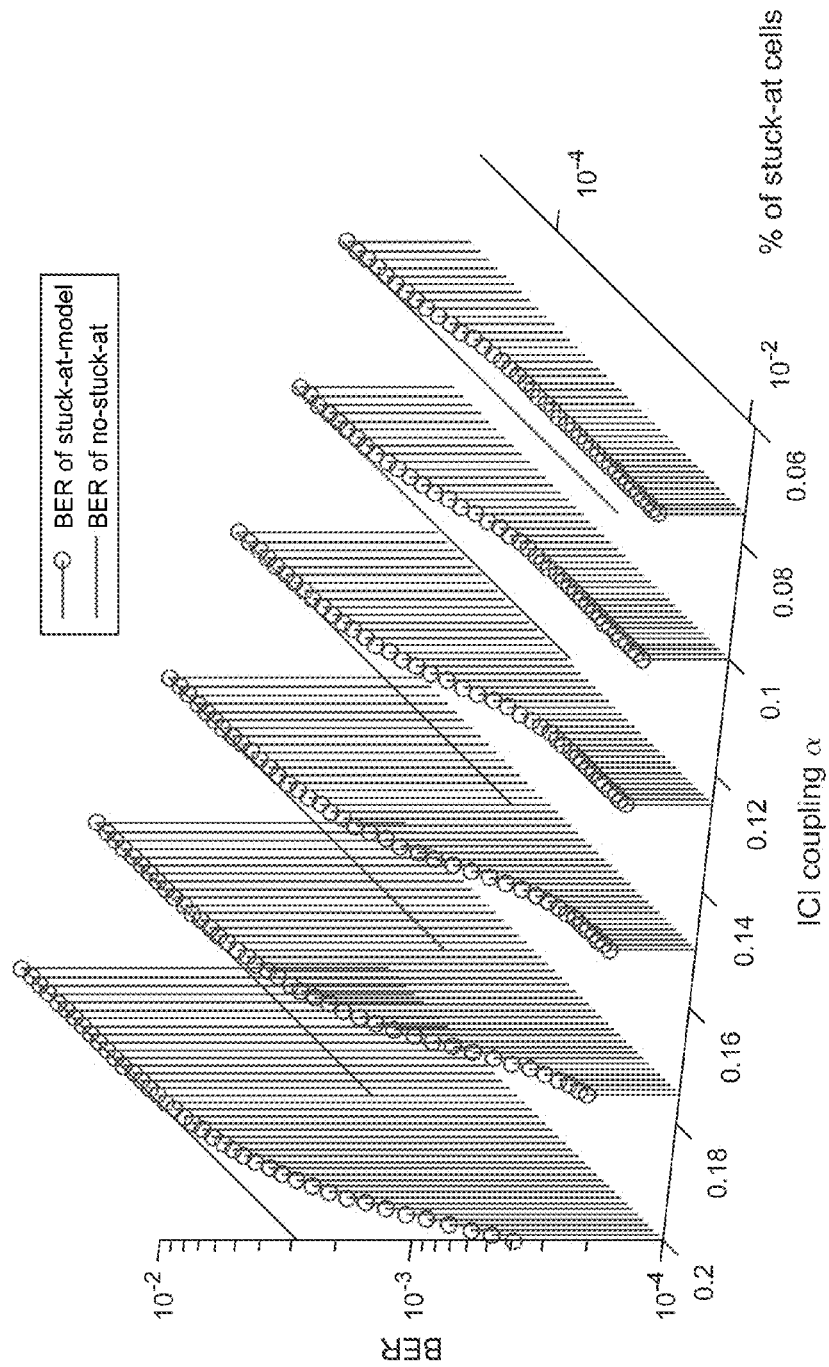
FIG. 13 illustrates that the stuck-at encoding scheme is beneficial across a wide range of capacitive coupling between memory cells in accordance with some embodiments.

FIG. 13 illustrates that the stuck-at encoding scheme is beneficial across a wide range of capacitive coupling between memory cells in accordance with some embodiments. In FIG. 12, the ICI coupling constant α indicates the extent of capacitive coupling between memory cells in the memory device. This figure illustrates that the disclosed stuck-at encoding scheme is effective across a wide range of coupling between memory cells. This figure also illustrates that as the coupling between the memory cells is increased, the BER improvement can become more significant.

Where reference is made herein to a method comprising two or more defined steps, the defined steps can be carried out in any order or simultaneously (except where the context would indicate otherwise), and the method can include one or more other steps which are carried out before any of the defined steps, between two of the defined steps, or after all the defined steps (except where the context would indicate otherwise).

Those of skill in the art would appreciate that various illustrations described herein may be implemented as electronic hardware, computer software, firmware, or combinations of two or more of electronic hardware, computer software, and firmware. To illustrate this interchangeability of hardware, software, and/or firmware, various illustrative blocks, modules, elements, components, methods, and algorithms have been described above generally in terms of their functionality. Whether such functionality is implemented as hardware, software, firmware, or a combination depends upon the particular application and design constraints imposed on the overall system. Skilled artisans may implement the described functionality in varying ways for each particular application. Various components and blocks may be arranged differently (for example, arranged in a different order, or partitioned in a different way) all without departing from the scope of the subject technology. An implementation of the disclosed subject matter can be realized in a centralized fashion in one computer system, or in a distributed fashion where different elements are spread across several interconnected computer systems. Any kind of computer system, or other apparatus adapted for carrying out the methods described herein, is suited to perform the functions described herein.

A typical combination of hardware and software could be a general purpose computer system with a computer program that, when being loaded and executed, controls the computer system such that it carries out the methods described herein. The disclosed subject matter can also be embedded in a computer program product, which comprises all the features enabling the implementation of the methods and systems described herein, and which, when loaded in a computer system is able to carry out these methods.

Computer program or application in the present context means any expression, in any language, code or notation, of a set of instructions intended to cause a system having an information processing capability to perform a particular function either directly or after either or both of the following a) conversion to another language, code or notation; b) reproduction in a different material form. Significantly, the systems and methods described herein may also be embodied in other specific forms without departing from the spirit or essential attributes thereof, and accordingly, reference should be had to the following claims, rather than to the foregoing specification, as indicating the scope of the systems and methods.

The present disclosure has been described in detail with specific reference to these illustrated embodiments. It will be apparent, however, that various modifications and changes can be made within the spirit and scope of the disclosure as described in the foregoing specification, and such modifications and changes are to be considered equivalents and part of this disclosure.

The invention claimed is:

1. A method comprising:
   determining, by a control unit of a memory device comprising a first memory cell, a voltage level of the first memory cell in an erased state;
   receiving, at the control unit from a host device, a first request to store a first data to the memory device comprising the first memory cell;
   encoding, by the control unit, the first data to generate an encoded first data, wherein a logical value of the encoded first data corresponding to a least significant bit of the first memory cell is a predetermined logical value regardless of a content of the first data when the voltage level of the first memory cell is within a predetermined voltage range; and
   storing, by the control unit, the logical value of the encoded first data to the least significant bit of the first memory cell,
   wherein encoding the first data further comprises encoding the first data using a decodable function that provides the predetermined logical value for the least significant bit of the first memory cell when the voltage level of the first memory cell is greater than a predetermined threshold.

2. The method of claim 1, wherein the predetermined threshold is determined, in part, based on a histogram of voltage levels of all memory cells in the memory device in their erased state.

3. The method of claim 1, wherein the predetermined logical value for the least significant bit of the first memory cell is zero.

4. The method of claim 1, wherein encoding the first data comprises encoding the first data using error correcting code.

5. The method of claim 1, further comprising receiving, at the control unit, a second request to store a second data to the memory device comprising a second memory cell, wherein the second memory cell is capacitively coupled to the first memory cell, wherein encoding the first data to generate the encoded first data comprises encoding the first data in part based on a logical value of the second data to be written into a least significant bit of the second memory cell.

6. The method of claim 5, wherein the first data is associated with a first page and the second data is associated with a second page.

7. The method of claim 1, wherein the memory cell is a two-bit multi-level cell.

8. A storage system comprising:
a memory device comprising a first memory cell for maintaining data; and
a control unit configured to:
determine voltage level of the first memory cell in an erased state;
receive, from a host device in communication with the storage system, a first request to store a first data to the memory device comprising the first memory cell;
encode the first data to generate an encoded first data, wherein a logical value of the encoded first data corresponding to a least significant bit of the first memory cell is a predetermined logical value regardless of a content of the first data when the voltage level of the first memory cell is within a predetermined voltage range; and
store the logical value of the encoded first data to the least significant bit of the first memory cell,
wherein the control unit is configured to encode the first data using a decodable function that provides the predetermined logical value for the least significant bit of the first memory cell when the voltage level of the first memory cell is greater than a predetermined threshold.

9. The system of claim 8, wherein the predetermined threshold is determined, in part, based on a histogram of voltage levels of all memory cells in the memory device in their erased state.

10. The system of claim 8, wherein the predetermined logical value for the least significant bit of the first memory cell is zero.

11. The system of claim 8, wherein the control unit is further configured to receive a second request to store a second data to the memory device comprising a second memory cell, wherein the second memory cell is capacitively coupled to the first memory cell, and encode the first data in part based on a logical value of the second data to be written into a least significant bit of the second memory cell.

12. The system of claim 11, wherein the first data is associated with a first page and the second data is associated with a second page.

13. The system of claim 8, wherein the memory cell is a two-bit multi-level cell.

14. A non-transitory computer readable medium having executable instructions operable to cause a control unit to:
determine a voltage level of a first memory cell in a memory device at an erased state;
receive, from a host device, a first request to store a first data to the memory device comprising the first memory cell;
encode the first data to generate an encoded first data, wherein a logical value of the encoded first data corresponding to a least significant bit of the first memory cell is a predetermined logical value regardless of a content of the first data when the voltage level of the first memory cell is within a predetermined voltage range; and
store the logical value of the encoded first data to the least significant bit of the first memory cell,
wherein the computer readable medium comprises executable instructions operable to cause the control unit to encode the first data using a decodable function that provides the predetermined logical value for the least significant bit of the first memory cell when the voltage level of the first memory cell is greater than a predetermined threshold.

15. The computer readable medium of claim 14, wherein the predetermined threshold is determined, in part, based on a histogram of voltage levels of all memory cells in the memory device in their erased state.

16. The computer readable medium of claim 14, further comprising executable instructions operable to cause the control unit to:
receive a second request to store a second data to the memory device comprising a second memory cell, wherein the second memory cell is capacitively coupled to the first memory cell, and
encode the first data in part based on a logical value of the second data to be written into a least significant bit of the second memory cell.

17. The computer readable medium of claim 14, wherein the memory cell is a two-bit multi-level cell.

* * * * *